(12) United States Patent
Swan et al.

(10) Patent No.: US 11,139,137 B2
(45) Date of Patent: Oct. 5, 2021

(54) COLLISION AVOIDANCE FOR PARTICLE BEAM INSTRUMENTS

(71) Applicant: Oxford Instruments Nanotechnology Tools Limited, Oxon (GB)

(72) Inventors: Stuart Andrew Swan, Oxon (GB); Grigore Moldovan, Oxon (GB); Angus Bewick, Oxon (GB)

(73) Assignee: Oxford Instruments Nanotechnology Tools Limited, Oxon (GB)

( * ) Notice: Subject to any disclaimer, the term of this patent is extended or adjusted under 35 U.S.C. 154(b) by 0 days.

(21) Appl. No.: 16/636,997

(22) PCT Filed: Aug. 9, 2018

(86) PCT No.: PCT/GB2018/052266
§ 371 (c)(1),
(2) Date: Feb. 6, 2020

(87) PCT Pub. No.: WO2019/030526
PCT Pub. Date: Feb. 14, 2019

(65) Prior Publication Data
US 2020/0168429 A1 May 28, 2020

(30) Foreign Application Priority Data
Aug. 9, 2017 (GB) ...................................... 1712788

(51) Int. Cl.
*H01J 37/02* (2006.01)
*G01N 23/2251* (2018.01)
*G01R 27/26* (2006.01)
(52) U.S. Cl.
CPC ........ *H01J 37/023* (2013.01); *G01N 23/2251* (2013.01); *G01R 27/2605* (2013.01); *H01J 2237/0203* (2013.01); *H01J 2237/024* (2013.01)

(58) Field of Classification Search
CPC ............ H01J 37/023; H01J 2237/0203; H01J 2237/024; H01J 37/265; H01J 37/28; G01N 23/2251; G01N 2223/418; G01R 27/2605
(Continued)

(56) References Cited

U.S. PATENT DOCUMENTS

2005/0007574 A1 1/2005 Van Der Meulen et al.
2012/0074317 A1 3/2012 Diemer et al.
(Continued)

OTHER PUBLICATIONS

Cvetanovic et al. "Design of a novel visual and control system for the prevention of the collision during the micro handling in a SEM chamber", Microelectronic Engineering, 87, 2010, pp. 139-143.

*Primary Examiner* — David A Vanore
(74) *Attorney, Agent, or Firm* — Blank Rome LLP

(57) ABSTRACT

A system for preventing collisions between components in a particle beam instrument is disclosed. The system is particularly beneficial in use with instruments wherein moveable components are used within a chamber that obscures them from being viewed from outside the chamber. The system comprises: a capacitance sensor configured to monitor the capacitance between a first component and a second component of the instrument, and a proximity module configured to: derive a capacitance parameter from the monitored capacitance between the first component and the second component; and output a proximity alert signal in accordance with a comparison between the derived capacitance parameter and a predetermined capacitance parameter threshold value.

18 Claims, 3 Drawing Sheets

(58) Field of Classification Search
USPC .................................................. 250/307, 310
See application file for complete search history.

(56) References Cited

U.S. PATENT DOCUMENTS

| | | | |
|---|---|---|---|
| 2014/0130810 A1* | 5/2014 | Azizian | A61B 46/10 |
| | | | 128/849 |
| 2018/0031728 A1* | 2/2018 | Han | G01S 17/04 |
| 2020/0168429 A1* | 5/2020 | Swan | H01J 37/28 |

* cited by examiner

COLLISION AVOIDANCE FOR PARTICLE BEAM INSTRUMENTS

RELATED APPLICATIONS

This application is a U.S. National Stage Application of International Application No. PCT/GB2018/052266, filed on Aug. 9, 2018, which claims priority of Great Britain Application No. 1712788.7, filed on Aug. 9, 2017. The entire contents of those applications are incorporated herein by reference.

FIELD OF INVENTION

The present invention relates to a system and method for preventing collisions between components in a particle beam instrument. The invention is applicable to electron microscopes and in particular is advantageous in providing protection from damage to an electron-sensitive camera system.

BACKGROUND TO THE INVENTION

Many particle beam instruments comprise moveable components that are vulnerable to collisions with one another when the instruments are in use. An example of such an instrument is a scanning electron microscope. With reference to the accompanying drawings, FIG. 1 is a schematic showing some parts of a system that are employed in a scanning electron microscope (SEM) for exploring the surface of a specimen. The electron beam is produced inside an evacuated chamber and usually focussed with a combination of magnetic lenses forming the "SEM column". When the focussed beam strikes a specimen, some electrons are scattered back from the specimen (backscattered electrons or BSE) or interact with the specimen to produce secondary electrons (SE) and a number of other emissions such as X-rays. For the last 30 years, systems have been commercially available for detecting the Kikuchi band patterns that are caused by diffraction of the emerging backscattered electrons, sometimes called "electron backscatter diffraction patterns" or EBSD patterns. These systems typically consist of a sensitive camera that records the optical image produced when backscattered electrons strike a phosphor. FIG. 1 shows a typical arrangement where a specimen is supported on a special tilt holder on the SEM stage and the EBSD camera is inserted through a port on the SEM vacuum chamber so that the phosphor is positioned close to the specimen where it will be hit by a diverging beam of electrons backscattered from the sloping specimen surface. When not in use, the camera is retracted to a safe position.

Typically the EBSD camera also carries a number of small semiconductor diodes mounted around the periphery of the sensitive phosphor. These diodes are used to measure the intensity of electrons scattered in particular directions. When the specimen surface is tilted to improve contrast for EBSD pattern formation, electrons are generally scattered in a forward direction so the diodes are sometimes referred to as "forescatter diode detectors" as shown in FIG. 1. An alternative geometry configuration uses a thin specimen that is supported so that the focussed electron beam is transmitted through the specimen and the camera phosphor is placed below the specimen so that electrons scattered from beneath the specimen strike the phosphor and form an image that contains a "transmitted electron Kikuchi pattern" or TKD pattern. When other signals are being detected, the region around the specimen can get very crowded and FIG. 2 shows an example where an X-ray detector is positioned alongside the EBSD camera system to detect X-rays emitted from the specimen.

When a user is investigating a specimen in the SEM, they may move the X-ray detector closer to the specimen to improve the X-ray signal and with continued movement the X-ray detector may collide with the EBSD camera. Alternatively, the user may drive the EBSD camera towards the specimen or move the stage to alter the specimen position so that the specimen or a side of the specimen holder may eventually collide with the sensitive surface of the EBSD camera. These scenarios are illustrated by FIG. 3 at the point before collision has occurred.

An X-ray detector is typically fitted with a magnetic electron trap to prevent the X-ray sensor from being flooded with electrons and a collimator to prevent X-rays emitted from surfaces other than the specimen from reaching the detector. This end piece effectively provides some mechanical protection for the X-ray sensor in case the detector tube is inserted too far or the specimen stage is moved so that the specimen or holder touches the detector. However, the sensitive front surface of the EBSD camera does not have that protection. In some systems the phosphor may be coated directly on to the surface of a fibre-optic that is used to transmit the light signals efficiently to a 2D CMOS camera. In this case, if the EBSD camera is inserted too far and strikes the specimen, or the specimen stage is moved so that the specimen strikes the sensitive EBSD camera surface, or if the X-ray detector is inserted too far so that the collimator strikes one of the forescatter diodes on the EBSD camera system, an accident may occur that requires an expensive repair and a lot of down time for the instrument. For this reason, most EBSD camera systems are fitted with a touch alarm which is activated when electrical contact is made between any conductive part of the EBSD camera body and a conductive surface on the specimen or specimen holder. That touch alarm can be linked to the system that drives insertion or retraction of the EBSD camera tube and/or the stage movement controller to shut down movement as soon as electrical contact is made or to automatically retract the EBSD camera away from the specimen area. However, if the stage or camera is moving, movement may continue for a short distance after the initial point of contact because of the latency before the touch alarm is able to halt movement. If it is the sensitive front surface of the EBSD detector that is touched, costly damage may still occur even with a small movement after initial touch.

The vulnerability of EBSD camera systems in SEM has long been recognised and operators have to be trained to be very methodical when inspecting a specimen in order to avoid expensive accidents. Therefore, it would be very beneficial to have a method to detect imminent collisions before the components touch so that movement can be suspended early enough to prevent collision. Moreover, a need exists for monitoring proximity between components in a range of particle beam instruments so as to avoid collisions between them.

SUMMARY OF THE INVENTION

In accordance with a first aspect of the invention there is provided a system for preventing collisions between components in a particle beam instrument, the system comprising: a capacitance sensor configured to monitor the capacitance between a first component and a second component of the instrument, and a proximity module configured to: derive a capacitance parameter from the monitored capacitance between the first component and the second component; and output a proximity alert signal in accordance with a comparison between the derived capacitance parameter and a predetermined capacitance parameter threshold value.

Contrary to prior art methods of addressing the problem of component collision in particle beam instruments such as electron microscopes, which typically employed touch sensing and programmable movement limits, the inventors have found that capacitance sensing can provide a solution to this issue that, advantageously, allows imminent collisions to be predicted and thereby prevented.

By outputting a proximity alert signal that may indicate that a distance between two components has been reduced to a critical threshold that represents a high likelihood of those components colliding based upon monitoring the capacitance between the components, the system provides a solution that is superior to conventional approaches in that it is able to detect proximity and thus pre-empt collisions, whereas prior art systems typically operate by detecting collisions when they occur. The system thereby facilitates the avoidance of collisions, and therefore damage avoidance also.

Thus the system may be suitable for preventing collisions by way of outputting a proximity alert signal that can indicate when a collision is likely to, or is about to, occur. The system is particularly beneficial in use with instruments wherein moveable components are used within a chamber that obscures them from being viewed from outside the chamber. Accordingly, in particle beam instruments which typically include a vacuum chamber that precludes direct observation of moveable system components that may be at risk of collision, such as a scanning electron microscope (SEM) for example, the system is particularly advantageous. The system may be used with any charged particle beam instrument, or any instrument that uses a focussed particle beam. In some preferred implementations, the particle beam instrument is an electron microscope, and more preferably is a scanning electron microscope.

The capacitance sensor being configured to monitor the capacitance between the first and second components may comprise said sensor being connected, or connectable, to said first and second components, in particular such that the sensor can monitor the capacitance between the components.

The capacitance sensor is typically configured to monitor the capacitance between a surface of the first component and a surface of the second component. In the instrument, one or both of the first and second components may be moveable, or may be moveable with respect to one another. Each component, or a surface thereof, and in particular an outer surface thereof, is typically electrically conductive. That is, it may be formed from a material that is electrically conductive. Thus the components or said surfaces thereof may be formed from a metal material. The capacitance sensor may monitor the capacitance between any two components that can act as a pair of conductors separated by an insulator so as to act as a capacitor.

The proximity module, which may be thought of as a collision prediction module, may be configured to derive the capacitance parameter differently in different embodiments. The capacitance parameter may be derived so as to comprise or provide information about the distance between the first and second components and/or the rate of change of said distance. The parameter may, for instance, be proportional to the capacitance or the rate at which the capacitance changes. Accordingly, the capacitance parameter may provide an indication of an imminent collision before the collision occurs.

The proximity module being configured to output the proximity alert signal in accordance with the comparison may comprise the proximity module being configured to output said signal based upon the result of that comparison. For example, a signal may be output if an evaluated relationship between the derived capacitance parameter and the predetermined capacitance parameter threshold value meets or fulfils a predetermined condition. In some embodiments, for instance, the proximity module is configured to output a proximity alert signal if the parameter is equal to, or has exceeded or fallen below, the threshold value. In some embodiments, an alert signal may be output if one value of the parameter as derived, or a predetermined number of derived parameter values in a series, is equal to, greater than, or less than the threshold value.

The comparison may be, or be based upon, a numerical difference. For example, a condition against which the relationship between the derived parameter values and the threshold value evaluated may be, for example, that the difference between them is less than a specific amount for a specific length of time, or for a number of sensor signal readings or data points.

The comparison in accordance with which the proximity module is configured to output a proximity alert signal may be configured such that an alert signal is output when a relationship between the derived parameter and the threshold value indicates an imminent collision between the first and second components. In other words, the predetermined relationship, or the predetermined condition against which a relationship is evaluated, may be configured such that, if the first and second components are moved with respect to one another so as to cause a collision between them, the condition is fulfilled, or the predetermined relationship exists, and accordingly the signal is output.

The form of the proximity alert signal and the means by which it is output may vary for different embodiments of the system. In some embodiments, the signal comprises an electronic signal that may be output by way of a wired or wireless data connection, for instance. In some embodiments, the signal is preferably in a format that can be received directly or indirectly by a system configured to control the relative movement of the first and second components. Such a system may thereby preferably use the received signal to alter the relative movement of the first and second components so as to prevent the collision, preferably by altering said movement in accordance with the signal. In some embodiments, the signal may include data that a system controlling the relative movement of the instrument components may use to make an alternation to their movement. For example, the signal may provide an indication as to the predicted time until the collision, or a degree or direction of movement required in order to prevent the collision. In some embodiments, the signal comprises a flag or alert indicating simply that a collision between the components corresponding to that sensor is imminent, which a control system may then use to slow or halt the movement of the second component relative to the first component, for example.

In some embodiments, the proximity alert signal comprises, or may be used to generate, an audible or visible signal or indication suitable for conveying information about the proximity, or the predicted imminent collision, to a human user. Such a signal may thereby be acted upon by a user, for example by indicating to a user that the component movement controlled by the user must be stopped in order to avoid a collision.

Thus the proximity alert signal may comprise either or both of an electrical impulse or electronic message transmitted by the system, and a gesture, action, or sound by which information or instructions may be conveyed to a human user.

As noted above, the comparison typically comprises a difference being calculated between the derived parameter and a threshold value. Preferably, obtaining or calculating this comparison may involve evaluating whether the derived parameter is equal to, or exceeds, or is less than the threshold. In typical applications of the system, the components, or the surfaces thereof, between which the capacitance is monitored are not parallel, planar plates as is the case in a typical, parallel-plate capacitor. Rather, in particle beam instruments such as electron microscopes, the moveable components which may be at risk of collision are non-planar in the shape of their outer surfaces, and may have surfaces that are curved or have complex shapes. Thus the capacitance between the components, or their surfaces, may be affected by their relative positioning and orientation, and in particular by the spacing between them, according to a relationship more complex than the simple relationship between capacitance and inter-plate distance in the parallel-plate model.

Typically, for instance, the distance or spacing between the surfaces of two given components being decreased, for example by moving the components towards one another, gives rise to an increase in capacitance. Although the capacitance parameter typically corresponds to distance, or the rate of change thereof, and can be used to infer these quantities, the inter-component distance and its rate of change need not necessarily be explicitly calculated by the system in order for an actionable proximity alert signal to be generated. Rather, an imminent collision may be identified and a signal according the output based upon the capacitance parameter and its relationship with the threshold value, without relating these to particular distances or distance change rates, if an appropriate threshold value is predetermined. An appropriate value may be preconfigured for a pair of first and second instrument components, for example, by way of deriving values for the capacitance parameter while the components are being moved relative to one another throughout a range of relative positions and/or range of movement speeds that correspond to safe operation in that they do not result in collision. The appropriate threshold value will typically vary according to the physical properties of the components, such as their shapes and constituent materials. Therefore, the appropriate threshold value may be different for different pairs, or sets, of first and second components.

The comparison may be performed by evaluating a relationship, that is a mathematical relationship. For example, the comparison may involve evaluating a difference between the derived parameter and the threshold value, or a quotient of a derive value and the threshold value, or a result of any mathematical function of, or operation based on, the parameter and the threshold. The module may be configured to obtain or calculate the comparison.

Although the capacitance parameter may be derived from the output of the capacitance sensor in a number of different ways, in some embodiments, the capacitance parameter comprises one or both of the monitored capacitance between the first component and the second component and a rate of change, that is a derivative with respect to time, of said monitored capacitance. However, the capacitance parameter may be any function of the monitored capacitance derived by way of any of a number of mathematical operations.

The outputting of the proximity alert signal may be performed based upon one or multiple data points, or values derived for the capacitance parameter from the monitored capacitance. It is beneficial in some embodiments to use a time-averaged signal from the capacitance sensor, or a time-averaged value of the derived capacitance parameter, since doing so may remove noise spikes or erratic measurements from the derived values. Thus, in some embodiments, the proximity module is configured to derive the capacitance parameter by calculating an average value of a capacitance signal provided by the capacitance sensor over a period of time. The parameter may be derived by way of a mathematical function such as an average, for example a median or a mean, or a moving average of the capacitance signal. The averaging operation may be performed in addition to any number of other operations performed on the data or signal from the capacitance sensor in order to derive the capacitance parameter. The average value calculated is typically the median. However, deriving the capacitance parameter may be performed by way of any of a number of signal averaging techniques. Deriving the capacitance parameter may be performed by obtaining an average of capacitance values monitored by the sensor, or it may involve a rate of change of average values, for example, a moving median or mean. The proximity module may, for example, be configured to derive a capacitance parameter value based upon a specified number of readings or values from the sensor. A rate of change of a moving median, for example, may be related to or proportional to the rate of change of capacitance.

As noted above, the capacitance sensor may output, directly or indirectly, discrete readings of the monitored capacitance. These may correspond to a plurality of data points that can be used in deriving the capacitance parameter. Thus the rate at which data points are output may define the period of time over which the average value is calculated. The period of time over which the average value is calculated is typically a predetermined period. This may be a fixed length of time, or it may vary based upon variables such as the degree of noise in the signal or the sampling rate. In some embodiments, the average is calculated based upon a fixed number of signal data points provided by the sensor. For example, the proximity module may take the last x data points provided by the sensor, where x is a configured integer, and calculate the median value thereof in deriving the capacitance parameter. In some embodiments, the number of data points used in calculating the average may be varied in accordance with the number of variables, as described above.

As noted previously in this disclosure, the relationship between the capacitance between two components and the proximity between various parts of the surfaces thereof may be complex or impractical to analyse numerically or empirically. However, it may not be necessary for this relationship to be known in order for the capacitance parameter to indicate critical proximity, that is proximity indicating a high likelihood of collision, when the value reaches a threshold. Typically, the capacitance parameter threshold value corresponds to a predetermined minimum safe value of a distance between a surface of the first component and a surface of the second component. The minimum safe value of the distance may be defined by the relative movement of components wherein distance values greater than or equal to the minimum do not result in collision between those components. Thus the threshold value corresponding to the minimum safe distance is typically calculated for a pair of first and second components by way of obtaining a range of derived parameter values as the components are moved relative to one another and identifying which of the parameter values correspond to safe and unsafe inter-component distances.

In many applications of the system, the particle beam instrument includes more than two components, wherein each component is at risk of collision with one or more other components. It is therefore beneficial to provide as part of the system a means for monitoring the proximity between any set of two instrument components that are at risk of colliding with one another. Therefore, in some embodiments the system further comprises one or more further capacitance sensors, each of which is configured to monitor the capacitance between a different set of two components of the instrument. In such embodiments, the proximity module is typically configured to: derive a capacitance parameter from the monitored capacitance between each of the different sets of components; obtain a comparison between each of the derived capacitance parameters and a corresponding predetermined capacitance parameter threshold value; and output a proximity alert signal in accordance with each of the comparisons.

One or both of the two components in any of the one or more sets of two components may also be one of a different set of two components.

The system may in this way be suitable for preventing collisions in a microscope having a third component, and may comprise a second capacitance sensor that is configured to monitor the capacitance between the first and third components. The system may also comprise a third capacitance sensor configured to monitor the capacitance between the second and third components. Likewise, in embodiments with further components, or further pairs of components at risk of collision, the system may include further capacitance sensors and may be configured to derive further capacitance parameters so as to output a proximity alert signal accordingly.

The predetermined capacitance parameter threshold value corresponding to each of the derived capacitance parameters may be configured separately, or so as to have a different value for each capacitance sensor. This is typically the case, since the different properties of the capacitors formed by the different pairs of components may lead to different values of the derived parameter corresponding to the critical inter-component distance for that pair. Furthermore, it may be appropriate in some embodiments to derive a capacitance parameter differently for different pairs of components. For instance, one pair of components may have a corresponding capacitance parameter comprising a capacitance value, while another may have a capacitance parameter comprising a rate of change of capacitance.

The proximity module may be configured to output the proximity alert signal in accordance with any of the comparisons. Typically, the proximity module is configured to output the proximity alert signal if any of the two or more obtained comparisons, which typically corresponds to the two or more sets of components between which capacitance is monitored, meets or fulfils a condition, as explained previously in connection with the first comparison. Thus a signal may be output if the proximity between any of the sets of components, including the set defined by the first and second component, indicates that those two components are likely to collide with one another. In some embodiments wherein the system comprises one or more further capacitance sensors, the proximity alert signal comprises information indicating the set of components to which the signal relates. The signal may relate to a set of components by way of the signal having been output in accordance with an evaluated relationship that is based upon the capacitance parameter derived from the capacitance monitored between the components of that set. The information may include or may result in an audible or visible indicator that allows a user to identify which components are critically close to one another and may collide. In response the user may halt or slow their relative movement, for example. Additionally, or alternatively, the information may be suitable for being interpreted by a receiving computer unit configured to halt, slow, or change the direction of the relative movement of the components of the set so as to avoid a collision between them.

In some instruments, such as scanning electron microscopes, the capacitance sensor may have a deleterious effect upon the functioning of the instrument. For instance, it has been found that a capacitance sensor monitoring the capacitance between components in an SEM chamber can cause interference with the SEM imaging being carried out using the instrument. Because of this, in preferred embodiments the system includes a means for addressing the issue of this interference. Accordingly, the system may further comprise an interlock module configured to selectively deactivate the capacitance sensor so as to reduce interference caused to the particle beam instrument by the capacitance sensor.

By providing an interlock, which is generally understood to be a device or mechanism for connecting or coordinating the functions of different devices or systems, it is possible in such embodiments to alleviate the interference or conflict between the instrument systems and the system of the present disclosure. The interference is typically electrical or electromagnetic interference. This will typically be understood as the fading or disturbance of received signals caused by unwanted signals from other sources, such as unshielded electrical equipment, and in some embodiments of the first aspect, from the capacitance sensor.

The interlock module may be configured to deactivate, or selectively deactivate the capacitance sensor. The interference caused to the particle beam instrument by the capacitance sensor may thus be reduced with respect to, or compared with, the interference that would be caused in absence of the interlock module, or without deactivating the capacitance sensor.

By way of an interlock module, therefore, the conflicting systems of the particle beam instrument and the capacitance sensor may be allowed to work together. The interlock module may be configured to deactivate the capacitance sensor in accordance with a monitored state of the instrument. Thus the selective deactivation may be dependent upon the manner in which the instrument is being used. Moreover, the interlock module may be configured to selectively deactivate the capacitance sensor depending upon the significance, or the degree, of interference being caused to the instrument by the capacitance sensor. The severity of the interference may also be dependent upon the state of the instrument, which may be monitored, as stated above.

It will be understood that the risk of a collision occurring is also dependent upon the manner in which the instrument is being used. The selective deactivation may be configured based upon data indicating the monitored state of the instrument, and accordingly be dependent upon the collision risk and the degree of interference. In some embodiments, the instrument may be controlled by a computer controller that may control the movement of components of the instrument. The controller may thereby monitor the state of the instrument by virtue of that controller controlling said state.

Therefore, the interlock module may be configured to deactivate the capacitance sensor when a preconfigured condition corresponding to either or both of a risk of collision lower than a specific threshold and a degree of interference greater than a specified threshold, is fulfilled.

In some embodiments, the interlock module is configured to selectively deactivate the capacitance sensor in accordance with either or both of: the comparison between the derived capacitance parameter and the predetermined capacitance parameter threshold value; and obtained data comprising information about said interference.

Thus the comparison may provide the interlock module with an indication of, or data representing, the likelihood of a component collision. The obtained data may, for example, be from the instrument itself or from a control system or control software comprised by the instrument or in communication therewith. The information about the interference may, in some embodiments, comprise an indication of, or a parameter quantifying, the interference. The information may indicate whether the interference is caused, or may indicate the degree to which it is being caused to the instrument. In some preferred embodiments, the interlock module is configured to monitor use of the instrument, and deactivate the capacitance sensor when the instrument is in use. This may involve the interlock module being configured to deactivate the capacitance sensor when, for example, a particle beam is being generated by the instrument, or when a detector or an imaging system of the instrument is active or is in use. These conditions may be evaluated in accordance with data obtained from a control system or software of the instrument, or from a monitoring module. The interlock module itself may be comprised by software configured to control the instrument, and in particular configured to control a particle beam, microscope, imaging, or sensor function or system of the instrument. In embodiments comprising two or more capacitance sensors, the interlock module may be configured to deactivate all of the capacitance sensors in order to reduce the interference. In some embodiments, the interlock module is configured to selectively deactivate a subset of the capacitance sensors comprised by the system in accordance with obtained data indicating that the interference is being caused by, or is being primarily caused by, said subset of sensors.

As noted previously in this disclosure, the system is particularly applicable to electron microscope instruments. Accordingly, in some embodiments, the system is for collision avoidance of components in an electron microscope chamber. Thus the instrument may be an electron microscope, and the first and second components may be in a chamber of the electron microscope. The system may be configured to collect data from a multiplicity of sensor channels, wherein each channel uses a sensor to measure the capacitance between one conductive object and ground at regular intervals, wherein the system is configured to use the data from each channel to calculate the rate of change of capacitance with time, whereby the combination of results for rate of change of capacitance from each channel are used to sense whether a collision situation is imminent.

Each of the multiplicity of sensor channels may correspond to a different set of two components. The sensor used by a first one of the channels is typically the same as the capacitance sensor described previously in this disclosure.

If a collision situation is imminent, the system may be configured to halt movement, or to alter the relative movement, of any component that are being moved in the vicinity of the specimen. Typically, a collision situation is deemed to be imminent if the rate of change of the capacitance with time for any one channel exceeds the threshold value for that channel. However, it will be understood that, in addition to the rate of change of capacitance, a capacitance parameter derived in any of a number of types of operation may be used to identify whether a collision situation is imminent.

The system may be configured to calculate the rate of change of capacitance with time by way of processing the capacitance data to remove the influence of the noise spikes. Such a processing may thus prevent the system from falsely identifying an imminent collision as a result of an anonymously high capacitance reading caused by sensor noise, for example. Typically, such processing of capacitance data uses a running median filter for capacitance results and a running median filter for results showing rate of change of capacitance with time.

The system may be used to generate alert signals based on the proximity of pairs of instrument components of a number of different types. For example, one conductive object, in some embodiments, is the conductive coating applied to the front surface of a camera that is used, or adapted, to detect electron diffraction patterns. Said one conductive object is typically all or part of one of the first and second components. In some embodiments, additional conductive objects, which may include all or part of the second component, or any of the components in further sets of components, are the conductive surrounds for forescatter diodes used in conjunction with an electron diffraction pattern camera.

The system may thus use a number of capacitance sensors that are connected to conductive surfaces of components within the SEM chamber and measure the capacitance to system ground. It is well known that capacitance measurement can be used to sense the relative position of two conductive surfaces. However, when the exact number of static and moving components is unknown and movement of any component is not necessarily controlled by the same control system, the inventors have found that it is in some cases not feasible to estimate distances of objects from capacitance measurements alone. Furthermore, as components are moved that are not likely to cause any collision, the inventors have also found that the capacitance measured between one surface and another may change because of the change in relative capacitance between those surfaces and the moving component. It has also been found that there are different scenarios that can give rise to a potential collision, and a measured capacitance between a single pair of conductors may not give a signal sufficient to detect all scenarios. Furthermore, problems have also been encountered with noise transients, leading to a need to prevent these noise "spikes" from giving rise to false alarms.

The system may therefore use a multiplicity of capacitance sensors to provide a number of channels of capacitance data, wherein each channel provides capacitance readings between different components inside an electron microscope chamber.

For each channel giving a capacitance value C, the capacitance may be monitored at regular intervals so that the rate of change of capacitance with time, $dC/dt$, can be calculated. When $dC/dt$ is seen to rise abruptly from recent values, an alarm may be generated, to indicate that collision is imminent.

To make the system insensitive to noise spikes, the capacitance value C can be taken to be the median of the last few measurements. Rather than testing successive measurements of $dC/dt$, the running median of a small number of contiguous values of $dC/dt$ may be calculated and changes between successive values of this running median tested for.

A single noise spike may be an outlier that would not affect any median value. However, a contiguous series of high values of dC/dt may give rise to a median that rapidly rises and can be indicative of two surfaces becoming very close.

The capacitance measured by each channel may have a different response to a moving object so a different threshold value is typically used for each channel to decide if dC/dt is high enough to indicate that a collision is imminent. Suitable thresholds for each channel may be determined by measuring dC/dt values for each channel when a series of movements of components are conducted that reflect the recommended operation of components that are safe from collision.

According to a second aspect of the invention, there is provided a particle beam instrument comprising a system according to the first aspect, wherein the system is configured to prevent collisions between a first component and a second component of the instrument. The system according to the first aspect may thus be included in a particle beam instrument in order to facilitate the avoidance of collision between components of that instrument. The avoidance of collision in particular may be effected by way of the particle beam instrument automatically stopping or altering the relative movement of the first and second components in response to the proximity alert signal being output by the proximity module. Accordingly, in some embodiments the particle beam instrument comprises a mechanism configured to alter the relative movement of the first and second components so as to prevent a collision between said components, if a proximity alert signal is output by the proximity module. The altering of the relative movement may typically comprise stopping the movement of one or both of the first and second components, or may comprise stopping their movement with respect to one another, that is their relative movement.

In accordance with a third aspect of the invention there is provided a method of preventing collisions between components in a particle beam instrument, the method comprising: monitoring, using a capacitance sensor, the capacitance between a first component and a second component of the instrument, deriving a capacitance parameter from the monitored capacitance between the first component and the second component, and outputting a proximity alert signal in accordance with a comparison between the derived capacitance parameter and a predetermined capacitance parameter threshold value.

In various embodiments according to the third aspect, the method may comprise steps corresponding to any of the features of the first aspect described above.

BRIEF DESCRIPTION OF THE DRAWINGS

Examples of the present invention will now be described, with reference to the accompanying drawings, in which.

DESCRIPTION OF EMBODIMENTS

In a first example system, an EBSD camera phosphor of an electron microscope instrument with which the system is used is coated with a thin layer of aluminium. In one embodiment, one sensor is connected to measure the capacitance between that layer and the system ground. Other sensors are connected to conductive holders on one or more of the forescatter diodes and the capacitance to system ground is measured for these additional channels. Each sensor responds to changes in capacitance between a sensing plate and ground which is influenced by the shape of objects, the permittivity of objects and the position of objects that are close to the sensing plate.

In one embodiment, a microcontroller is used to measure capacitance using an oscillator (for example, Texas Instruments MSP430 platform and techniques described in Texas Instruments application note SLAA490D-April 2011-Revised August 2015 "Capacitive Touch Software Library"). An oscillator with a typical frequency of 1400 kHz where the oscillator frequency varies with capacitance and resistive load and measure capacitance every 50 ms is used. One channel measures the capacitance between the conductive aluminium coating on the front of the EBSD camera and ground. Additional independent channels are used to measure the capacitance between the conductive holder for each of the forescatter diodes and ground. For each channel, a sequence of capacitance values is provided, one every 50 ms, and the median of the last three measurements is taken to be the current capacitance value, C. The difference between successive median values of C is thus proportional to dC/dt for that channel. The running median of the last three values of dC/dt is calculated, and if two successive values of this running median exceed a threshold, then the channel outputs an alarm signal to initiate corrective action to avoid collision. Thus, any one channel can detect a potential collision situation within two 50 ms periods that gives a latency of 100 ms.

If the EBSD camera is being moved under motor control, then any alarm signal is used to immediately stop movement before collision occurs. Similarly, if the X-ray detector is being moved under motor control, then any alarm signal is used to halt movement before collision occurs. Likewise, if any other component is being moved under motor control, that movement can be halted in response to any alarm signal generated by one or more of the sensing channels. If the component is being moved manually or under control that cannot be linked to the channel alarms, then either a visual or audible alarm can be generated, or the EBSD camera can be retracted away from the specimen area to a position where the fragile front surface is safe from collision.

Figure 1:
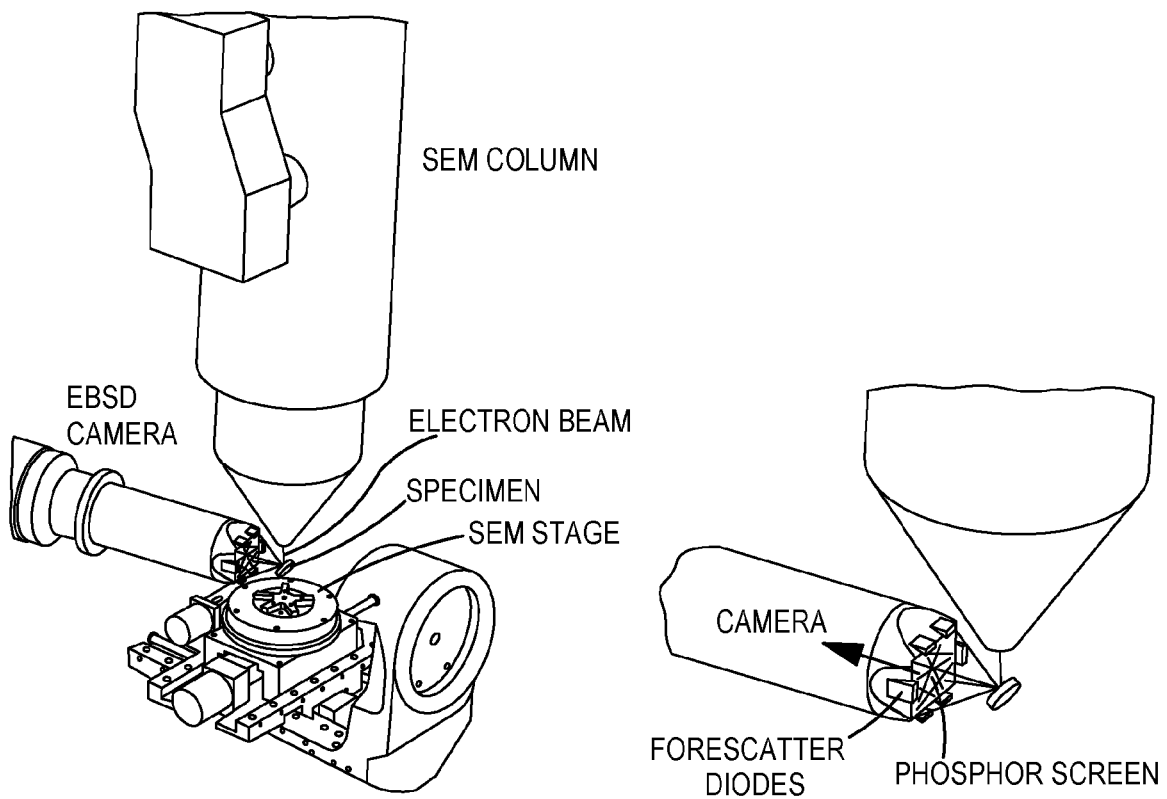
FIG. 1 shows two schematic perspective views of an electron backscatter diffraction (EBSD) detection system in an SEM. At B the enlarged detail of part of the apparatus depicted in A is shown, illustrating the forescatter diode detectors and the direction of retraction to remove the EBSD camera to a safe position when not in use.
Figure 2:
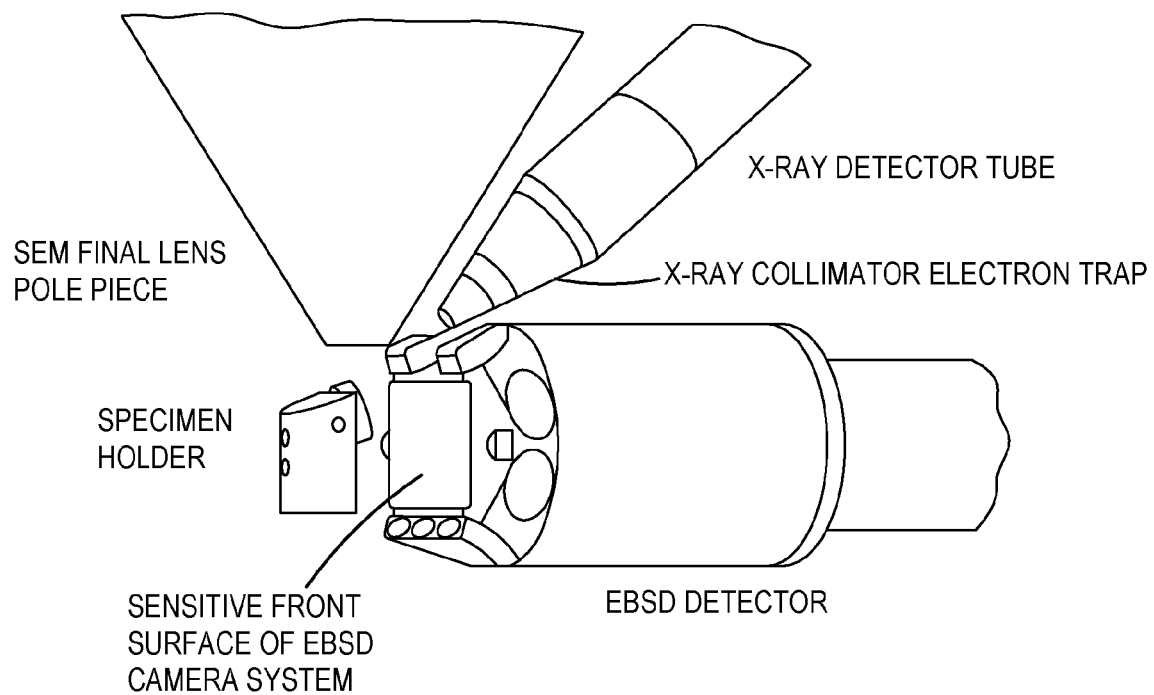
FIG. 2 is a schematic showing the close proximity of components in the vicinity of the specimen in a typical particle beam instrument.
Figure 3:
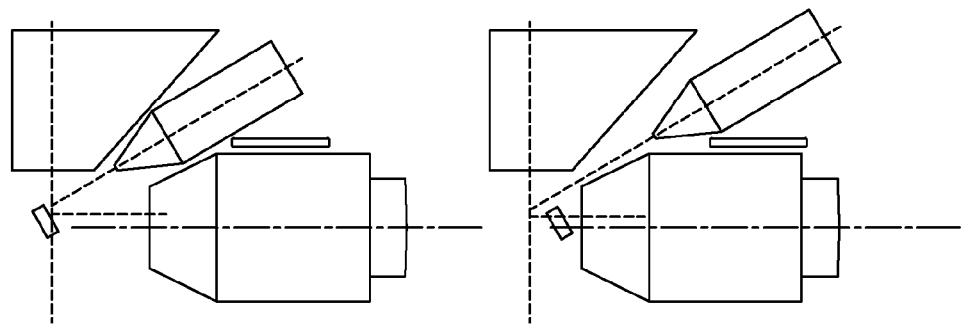
FIG. 3 illustrates two stages of relative movements of instrument components that could give rise to collisions of a sensitive region of an EBSD camera system of the instrument with other components such as the X-ray detector of the instrument or the specimen within the instrument; and, FIG. 4 is a graph showing, for an example system according to the invention, the output from one capacitor sensor channel when an EBSD camera of an instrument is driven towards a conductive target, and the threshold value of 50 that is configured for that channel.
Figure 4:
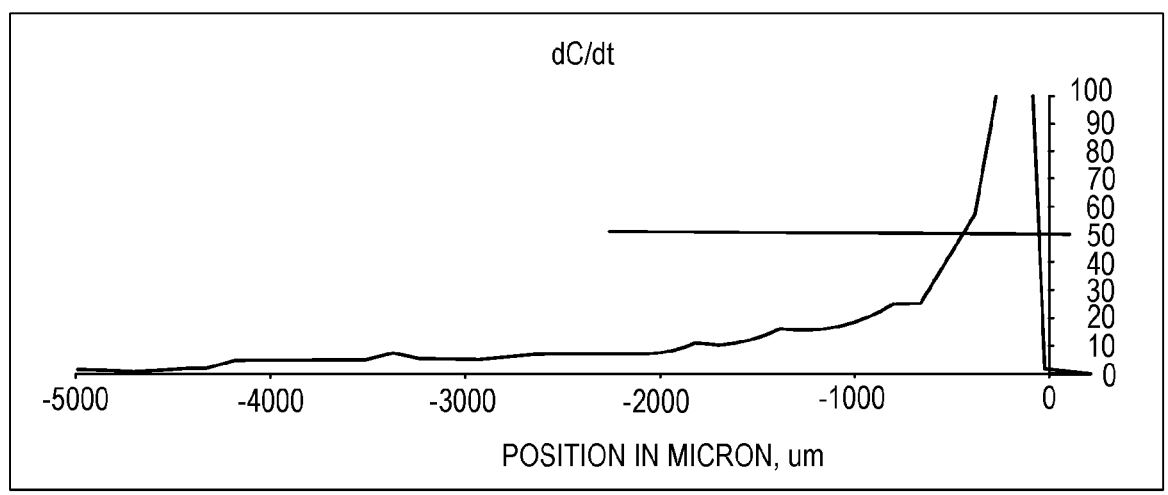

With a latency of 100 ms, a component moving at 1 mm/second should be halted within a distance of 0.1 mm. Therefore, a suitable threshold for collision detection will distinguish between the "background" rate of change of capacitance, dC/dt, when the component is far from collision and the rapid rise in dC/dt that occurs when the component gets close to 0.1 mm from a collision condition. The dC/dt values from the different channels are very different because of the different sizes and positions of the effective capacitance plate relative to ground in each case. By using either controlled movements of each component and monitoring dC/dt away from a collision condition, or by measuring capacitance at a series of static positions and deducing the dC/dt that will be measured under a controlled movement, the maximum background level of dC/dt is established for each channel that can occur with a movement rate that will be used in practice to move any component. An alarm threshold for each channel is then set at some multiple of this maximum background level of dC/dt for the channel. FIG. 4 shows how the processed value of dC/dt varies for a single channel connected to the conductive front surface of an EBSD camera when the camera is driven at 1 mm/second towards a conductive target. When dC/dt exceeds the channel threshold of 50, the camera surface is 400 µm (0.4 mm) from the target when a potential collision is detected. With a latency of 100 ms, the camera movement is halted after a further 0.1 mm of movement and is therefore still 0.3 mm from the target when it comes to rest. Because the thresholds for each capacitance sensor channel are for the processed dC/dt estimate, the thresholds need to be adjusted in proportion to the rate of movement for the component.

The invention claimed is:

1. A method of preventing collisions between components in a particle beam instrument, the method comprising:
   monitoring, using a capacitance sensor, the capacitance between a first component and a second component of the instrument,
   deriving a capacitance parameter from the monitored capacitance between the first component and the second component, and
   outputting a proximity alert signal in accordance with a comparison between the derived capacitance parameter and a predetermined capacitance parameter threshold value.

2. The method according to claim 1, wherein the capacitance parameter comprises one or both of the monitored capacitance between the first component and the second component and a rate of change of the monitored capacitance.

3. The method according to claim 1, wherein the step of deriving the capacitance parameter is performed by calculating an average value of a capacitance signal provided by the capacitance sensor over a period of time.

4. The method according to claim 1, wherein the capacitance parameter threshold value corresponds to a predetermined minimum safe value of a distance between a surface of the first component and a surface of the second component.

5. The method according to claim 1, wherein the method further comprises:
   monitoring, using each of one or more further capacitance sensors, the capacitance between a different set of two components of the instrument;
   deriving a capacitance parameter from the monitored capacitance between each of the different sets of components;
   obtaining a comparison between each of the derived capacitance parameters and a corresponding predetermined capacitance parameter threshold value; and
   outputting a proximity alert signal in accordance with each of the comparisons from the obtaining step.

6. The method according to claim 5, wherein the proximity alert signal in accordance with each of the comparisons from the obtaining step is output in accordance with an indication of the set of components to which the signal relates.

7. The method according to claim 1, further comprising selectively deactivating the capacitance sensor so as to reduce interference caused to the particle beam instrument by the capacitance sensor.

8. The method according to claim 7, wherein the step of selectively deactivating the capacitance sensor is performed in accordance with either or both of: the comparison between the derived capacitance parameter and the predetermined capacitance parameter threshold value; and obtained data comprising information about the interference.

9. The method according to claim 7, wherein the method further comprises monitoring use of the instrument, and deactivating the capacitance sensor when the instrument is in use.

10. The method according to claim 1 for collision avoidance of components in an electron microscope chamber, the method further comprising:
    collecting capacitance data from a multiplicity of sensor channels,
    measuring, using a sensor for each channel, the capacitance between one conductive object and ground at regular intervals,
    calculating, using the capacitance data from each channel, the rate of change of capacitance with time, and
    sensing, using the combination of results for rate of change of capacitance from each channel, whether a collision situation is imminent.

11. The method according to claim 10, wherein if a collision situation is imminent, the method further comprises halting movement of any components that are being moved in the vicinity of a specimen.

12. The method according to claim 10, wherein a collision situation is deemed to be imminent if the rate of change of capacitance with time for any one channel exceeds a threshold value for that channel.

13. The method according to claim 10, wherein the method further comprises calculating the rate of change of capacitance with time by way of processing the capacitance data to remove the influence of noise spikes.

14. The method according to claim 13, wherein the processing of the capacitance data uses a running median filter for capacitance results and a running median filter for results showing rate of change of capacitance with time.

15. The method according to claim 10, wherein the one conductive object comprises a conductive coating applied to the front surface of a camera that is used to detect electron diffraction patterns.

16. The method according to claim 15, wherein additional conductive objects are the conductive surrounds for forescatter diodes used in conjunction with an electron diffraction pattern camera.

17. The method according to claim 1, wherein the method prevents collisions between the first component and the second component of the instrument.

18. The method according to claim 17 further comprising altering the relative movement of the first and second components so as to prevent a collision between the components, if the proximity alert signal is output in accordance with the outputting step.

* * * * *